(12) United States Patent
Cho

(10) Patent No.: US 8,288,784 B2
(45) Date of Patent: Oct. 16, 2012

(54) ORGANIC LIGHT EMITTING DISPLAY DEVICE

(75) Inventor: Jae-Young Cho, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 69 days.

(21) Appl. No.: 12/880,052

(22) Filed: Sep. 10, 2010

(65) Prior Publication Data

US 2011/0062475 A1  Mar. 17, 2011

(30) Foreign Application Priority Data

Sep. 15, 2009 (KR) .................. 10-2009-0086935

(51) Int. Cl.
*H01L 33/00* (2010.01)
*F21V 33/00* (2006.01)

(52) U.S. Cl. .............. 257/89; 257/98; 257/40; 313/500; 313/501; 313/502; 313/504

(58) Field of Classification Search .......... 313/500–512; 445/24; 257/40, E51.018, E51.026, E51.001, 257/89, 98, 88
See application file for complete search history.

(56) References Cited

U.S. PATENT DOCUMENTS

| | | | | |
|---|---|---|---|---|
| 6,133,692 A * | 10/2000 | Xu et al. | ................ | 313/506 |
| 7,247,394 B2 * | 7/2007 | Hatwar et al. | ................ | 428/690 |
| 7,750,559 B2 * | 7/2010 | Furugori | ................ | 313/504 |
| 7,863,808 B2 * | 1/2011 | Terao | ................ | 313/501 |
| 7,915,812 B2 * | 3/2011 | Hasegawa | ................ | 313/504 |
| 8,076,841 B2 * | 12/2011 | Shiobara et al. | ................ | 313/504 |
| 2003/0117070 A1 | 6/2003 | Komatsu et al. | | |
| 2007/0046180 A1 * | 3/2007 | Kao et al. | ................ | 313/504 |
| 2008/0111474 A1 * | 5/2008 | Sung et al. | ................ | 313/504 |
| 2009/0091241 A1 * | 4/2009 | Tsou et al. | ................ | 313/504 |
| 2009/0096359 A1 * | 4/2009 | Lee et al. | ................ | 313/504 |
| 2010/0156280 A1 * | 6/2010 | Song et al. | ................ | 313/504 |
| 2011/0018429 A1 * | 1/2011 | Spindler et al. | ................ | 313/504 |
| 2011/0031515 A1 * | 2/2011 | Mizuno et al. | ................ | 257/89 |
| 2011/0042696 A1 * | 2/2011 | Smith et al. | ................ | 257/89 |
| 2011/0062427 A1 * | 3/2011 | Jeong et al. | ................ | 257/40 |

FOREIGN PATENT DOCUMENTS

| | | |
|---|---|---|
| KR | 2002-0062583 A | 7/2002 |
| KR | 10-2005-0029426 A | 3/2005 |
| KR | 10-2005-0031991 A | 4/2005 |
| KR | 10-2006-0039460 A | 5/2006 |
| KR | 10-2008-0047782 A | 5/2008 |

OTHER PUBLICATIONS

Korean Registration Determination Certificate for Korean Priority Patent Application No. 19-2009-0086935, 5 pages, dated Jul. 27, 2011.

* cited by examiner

*Primary Examiner* — Michael Shingleton
(74) *Attorney, Agent, or Firm* — Christie, Parker & Hale, LLP

(57) ABSTRACT

An organic light emitting display device includes a substrate and a plurality of pixels on the substrate. The pixels include a plurality of first electrodes, a second electrode, a white light emitting layer, and a first thin film layer between the first electrodes and the second electrode. White light emitted from the white light emitting layer causes resonance to occur between the first electrodes and the second electrode.

28 Claims, 3 Drawing Sheets

ORGANIC LIGHT EMITTING DISPLAY DEVICE

CROSS-REFERENCE TO RELATED APPLICATION

This application claims priority to and the benefit of Korean Patent Application No. 10-2009-0086935, filed in the Korean Intellectual Property Office on Sep. 15, 2009, the entire content of which is incorporated herein by reference.

BACKGROUND

1. Field

Aspects of embodiments of the present invention relate to an organic light emitting display device and, more particularly, to an organic light emitting display device having improved light efficiency.

2. Description of the Related Art

Organic light emitting display devices are self-emission type display devices which emit light by applying voltages to an anode, a cathode, and an organic light emitting layer between the anode and the cathode, thereby recombining electrons and holes in the organic light emitting layer. When white light is emitted from the organic light emitting layer of some display devices, the white light passes through color filters on a light path, thereby realizing color display. However, when the white light emitted from the organic light emitting layer passes through the color filters, light efficiency may be deteriorated.

SUMMARY

Embodiments of the present invention provide for an organic light emitting display device having improved light efficiency.

In an exemplary embodiment of the present invention, an organic light emitting display device is provided. The organic light emitting display device includes a substrate and a plurality of pixels on the substrate. Each of the pixels is configured to emit light of one of a plurality of second colors for forming white light when combined. The plurality of pixels includes a plurality of first electrodes, a second electrode, a white light emitting layer between the first electrodes and the second electrode, and a first thin film layer between the first electrodes and the second electrode. The white light emitting layer includes a plurality of light emitting layers, each being configured to emit light of one of a plurality of first colors for forming white light when combined. The first thin film layer has a plurality of thicknesses corresponding to the plurality of second colors. Each of the plurality of pixels is further configured to emit light of the one of the plurality of second colors when white light emitted from the white light emitting layer causes resonance to occur between the first electrodes and the second electrode.

The first thin film layer may include at least one selected from the group consisting of a hole injection layer, a hole transport layer, a hole blocking layer, an electron injection layer, an electron transport layer, and an electron blocking layer.

The first thin film layer may exist in less than all of the plurality of pixels.

The first thin film layer may be formed by using laser induced thermal imaging (LITI).

The first thin film layer may be formed by using inkjet printing or nozzle printing.

The plurality of pixels may further include a second thin film layer between the first electrodes and the second electrode.

The second thin film layer includes at least one selected from the group consisting of a hole injection layer, a hole transport layer, a hole blocking layer, an electron injection layer, an electron transport layer, and an electron blocking layer.

The second thin film layer may be concurrently formed for each of the plurality of pixels.

The plurality of first colors may be the same as the plurality of second colors.

The plurality of first colors may include three colors.

The plurality of first colors may include red, green, and blue.

The plurality of second colors may include three colors.

The plurality of second colors may include red, green, and blue.

The organic light emitting display device may further include a pixel-defining layer formed around the first electrodes to define a light emitting region of the plurality of pixels.

The organic light emitting display device may further include a sealing member on the second electrode to seal the white light emitting layer and the first thin film layer.

The sealing member may include a substrate formed of glass.

The sealing member may include a plurality of thin film layers formed by alternating a plurality of organic layers and inorganic layers.

The organic light emitting display device may further include a filling member between the second electrode and the sealing member.

The first electrodes and the second electrode may be respectively formed of reflective electrodes and a semitransparent electrode.

According to another embodiment of the present invention, another organic light emitting display device is provided. The organic light emitting display device includes a substrate and a plurality of pixels on the substrate. Each of the pixels is configured to emit red, green, or blue light. The plurality of pixels includes a plurality of first electrodes, a second electrode, a white light emitting layer between the first electrodes and the second electrode, a first thin film layer between the first electrodes and the second electrode, and color filters. The white light emitting layer includes light emitting layers configured to emit red, green, and blue light for forming white light when combined. The first thin film layer has a first thickness in each of the plurality of pixels configured to emit red light, a second thickness different than the first thickness in each of the plurality of pixels configured to emit green light, and a third thickness different than the first and second thicknesses in each of the plurality of pixels configured to emit blue light. The color filters are in only some of the plurality of pixels based on the color of light emitted by the some of the plurality of pixels. Each of the plurality of pixels is further configured to emit the one of red light, green light, or blue light when white light emitted from the white light emitting layer causes resonance to occur between the first electrodes and the second electrode. Light in the only some of the plurality of pixels is emitted through the color filters in the only some of the plurality of pixels. Light in remaining ones of the plurality of pixels is emitted without passing through the color filters.

The first thin film layer may include at least one selected from the group consisting of a hole injection layer, a hole transport layer, a hole blocking layer, an electron injection layer, an electron transport layer, and an electron blocking layer.

The plurality of pixels may further include a second thin film layer between the first electrodes and the second electrode.

The second thin film layer may include at least one selected from the group consisting of a hole injection layer, a hole transport layer, a hole blocking layer, an electron injection layer, an electron transport layer, and an electron blocking layer.

The organic light emitting display device may further include a sealing member on the second electrode to seal the white light emitting layer and the first thin film layer.

The organic light emitting display device may further include a filling member between the second electrode and the sealing member.

The first electrodes and the second electrode may be respectively formed of reflective electrodes and a semitransparent electrode.

The color filters may be on a surface of a sealing member or the substrate.

The organic light emitting display device may further include black matrix between the color filters.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, aspects of the present invention will be described more fully with reference to accompanying drawings in which some exemplary embodiments are shown.

Figure 1:
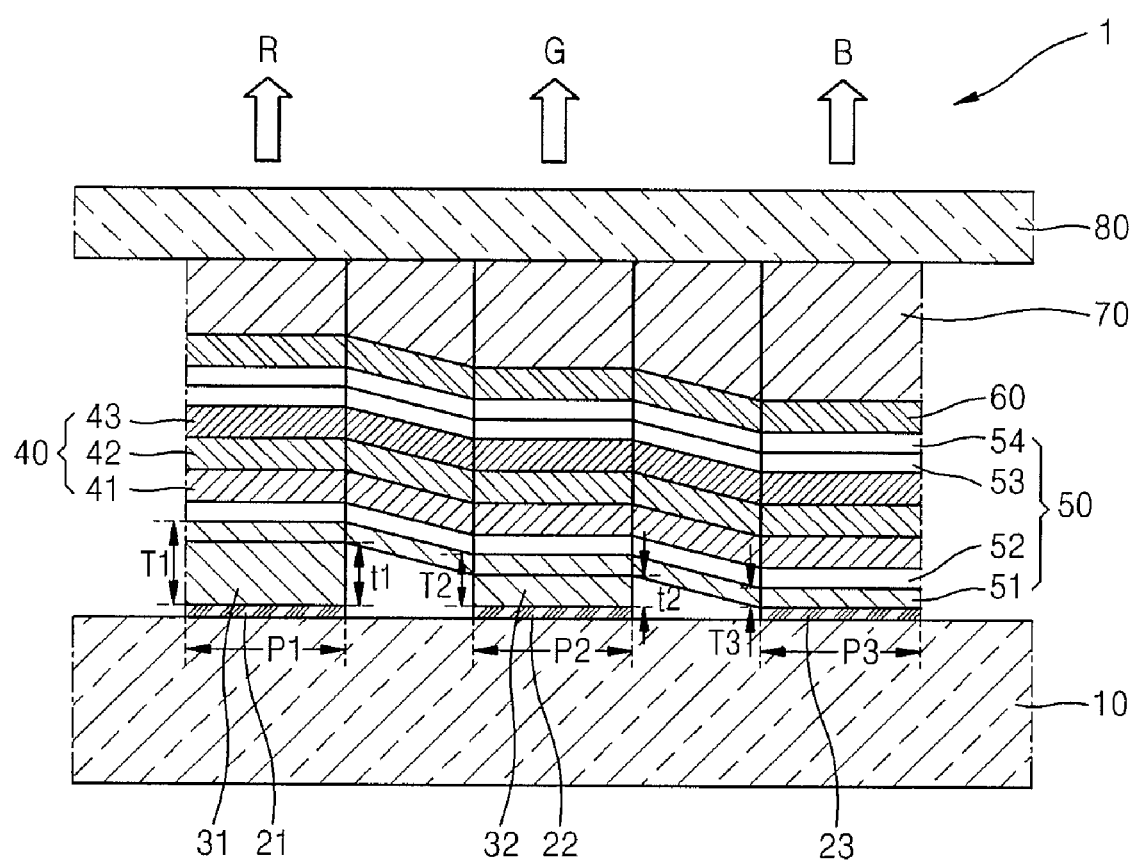
FIG. 1 is a cross-sectional view schematically illustrating some pixels in an organic light emitting display device, according to an embodiment of the present invention.

An organic light emitting display device 1 according to an embodiment of the present invention will be described with reference to FIG. 1. FIG. 1 is a cross-sectional view schematically illustrating some pixels in the organic light emitting display device 1.

Referring to FIG. 1, the organic light emitting display device 1 includes a plurality of pixels P1, P2, and P3 on a substrate 10. The substrate 10 may be formed of a transparent glass material such as $SiO_2$. The substrate 10 may be also formed of a non-transparent material or may be formed of other materials such as plastic.

In addition, a buffer layer (not illustrated) formed of $SiO_2$ and/or SiNx may be formed on the substrate 10 in order, for example, for the substrate 10 to provide a flat surface on the substrate and to prevent impurities from penetrating. Moreover, in an active matrix organic light emitting display device, a plurality of thin film transistors (not illustrated) respectively connected to the plurality of pixels P1, P2, and P3 may be formed on the substrate 10.

Each of the plurality of pixels P1, P2, and P3 may emit a different color (for instance, one of primary colors, such as red, green, or blue). If these colors are optically mixed (or combined), white light may be realized. For convenience of description, it is assumed that the first pixel P1 emits red light, the second pixel P2 emits green light, and the third pixel P3 emits blue light.

A plurality of first electrodes 21, 22, and 23 and a second electrode 60 are formed (or located) on the substrate 10. A white light emitting layer 40, first thin film layers 31 and 32, a second thin film layer 50, a filling member 70, and the second electrode 60 are interposed (or located) between the plurality of first electrodes 21, 22, and 23 and a sealing substrate 80.

The first electrodes 21, 22, and 23 may be formed in a pattern (for example, a predetermined pattern) by using photolithography. In FIG. 1, thicknesses of the first electrodes 21, 22, and 23 respectively formed in the pixels P1, P2, and P3 are the same.

If the organic light emitting display device 1 is a passive matrix (PM) type, the patterns of the first electrodes 21, 22, and 23 may be stripe-lines that are spaced apart from each other. On the other hand, if the organic light emitting display device 1 is an active matrix (AM) type, the first electrodes 21, 22, and 23 may respectively correspond to the pixels P1, P2, and P3.

The second electrode 60 is disposed (or located) on the first electrodes 21, 22, and 23. If the organic light emitting display device is a PM type, the second electrode 60 may have a stripe form that is perpendicular to the patterns of the first electrodes 21, 22, and 23. On the other hand, if the organic light emitting display device is an AM type, the second electrode 60 may be formed as a common layer throughout an entire active region on which an image is realized. The first electrodes 21, 22, and 23 may act as anode electrodes and the second electrode 60 may act as a cathode electrode, or vice versa.

In order to realize a microcavity effect, the first electrodes 21, 22, and 23 and the second electrode 60 that face each other with the white light emitting layer 40 interposed therebetween are formed of a combination of a reflective electrode and a semitransparent electrode. For example, if the organic light emitting display device 1 is a bottom emission type, whereby an image is realized in a direction of the substrate 10, the first electrodes 21, 22, and 23 may be semitransparent electrodes and the second electrode 60 may be a reflective electrode. By way of further example, if the organic light emitting display device 1 is a top emission type, whereby an image is realized in a direction of the sealing substrate 80, the first electrodes 21, 22, and 23 may be reflective electrodes and the second electrode 60 may be a semitransparent electrode.

For ease of description, assume that the organic light emitting display device 1 in FIG. 1 is a top emission type, so that the first electrodes 21, 22, and 23 are formed as reflective electrodes and the second electrode 60 is formed as a semitransparent electrode. The first electrodes 21, 22, and 23 may be formed of a reflective metal such as silver (Ag), aluminum (Al), gold (Au), platinum (Pt), or chromium (Cr), or an alloy containing one or more of these or other suitable metals. In addition, the first electrodes 21, 22, and 23 may be formed as a double-layer or a triple-layer further including an indium tin oxide (ITO) layer or an indium zinc oxide (IZO) layer on an upper portion and/or a lower portion of the reflective metal.

Further, the second electrode 60 is formed as a common electrode. The second electrode 60 may be formed of a semi-reflective/semitransparent metal. The semi-reflective/semitransparent metal may be an alloy of magnesium (Mg) and silver (Ag), a metal such as silver (Ag), aluminum (Al), gold (Au), platinum (Pt), or chromium (Cr), or an alloy containing one or more or these or other suitable metals. Here, the second electrode 60 may have a sufficient thickness to reach a reflectivity of 5% or more and a transmissivity of 50% or more.

Although not illustrated in FIG. 1, a pixel-defining layer (PDL) may be formed outside of (for example, around) the first electrodes 21, 22, and 23 to define a light emitting region.

First thin film layers 31 and 32, each having a different thickness, are formed in the pixels P1 and P2 on the first electrodes 21 and 22. For instance, in FIG. 1, a thickness t1 of the first thin film layer 31 formed in the first pixel P1, which emits red light, is the largest, while a thickness t2 of the first thin film layer 32 formed in the second pixel P2, which emits green light, is less than the thickness t1 of the first thin film layer 31 formed in the first pixel P1. In the embodiment shown in FIG. 1, no first thin film layer is formed in the third pixel P3, which emits blue light.

The first thin film layers 31 and 32 may include at least one selected from the group consisting of a hole injection layer (HIL), a hole transport layer (HTL), a hole blocking layer (HBL), an electron injection layer (EIL), an electron transport layer (ETL), and an electron blocking layer (EBL). For example, in FIG. 1, the hole injection layer (HIL) is selected as the first thin film layers 31 and 32.

The first thin film layers 31 and 32 may be formed to each have a different thickness on each pixel by using laser induced thermal imaging (LITI). In addition, the first thin film layers 31 and 32 may be patterned on each pixel with each different thickness by using inkjet printing or nozzle printing.

The second thin film layer 50 formed in the plurality of pixels P1, P2, and P3 as a common layer having a same thickness throughout is interposed between the first electrodes 21, 22, and 23 and the second electrode 60. In addition, the white light emitting layer 40 is interposed between layers of the second thin film layer 50. The second thin film layer 50 may include at least one selected from the group consisting of a hole injection layer (HIL), a hole transport layer (HTL), a hole blocking layer (HBL), an electron injection layer (EIL), an electron transport layer (ETL), and an electron blocking layer (EBL).

For example, in FIG. 1, the second thin film layer 50 sequentially includes a HIL 51, a HTL 52, an ETL 53, and an EIL 54 in a direction from the first electrodes 21, 22, and 23 to the second electrode 60. However, the second thin film layer 50 is not limited to the above selected layers.

The HIL 51 is formed in each of the pixels P1, P2, and P3 as a common layer. The HIL 51 may be formed of a generally used material selected from the group including copper phthalocyanine (CuPc), 4,4',4"-tris(N-(3-methylphenyl)-N-phenylamino)triphenylamine) (MTDATA), and mixtures thereof.

For example, in FIG. 1, a HIL is selected as the first thin film layers 31 and 32, and the HIL 51 is selected as one of the layers for forming the second thin film layer 50 as a common layer having the same thickness throughout and is formed on the first thin film layers 31 and 32 in the entire pixels P1 and P2, respectively, and on first electrode 23 in the entire pixel P3. Accordingly, total thicknesses T1, T2, and T3 obtained by adding the first thin film layers 31 and 32 and the HIL 51 of the second thin film layer 50 vary in each pixel P1, P2, and P3. That is, the thickness T1 of the HILs 31 and 51 in the first pixel P1 is the largest, the thickness of the HILs 32 and 51 in the second pixel P2 is less than T1, and the thickness T3 of the HIL 51 in the third pixel P3 is the smallest.

The HTL 52 is formed on the HIL 51 in the pixels P1, P2, and P3 as a common layer having the same thickness throughout. The HTL 52 may be, for example, formed of N,N'-Di (naphthalene-1-yl)-N,N'-diphenyl-benzidine (NPB) or polyethylenedioxythiophene (PEDOT).

The white light emitting layer 40 sequentially including light emitting layers 41, 42, and 43 that respectively emit red, green, and blue light that are combined to produce white light, is formed on the HTL 52 in the pixels P1, P2, and P3 as a common layer.

Note that in FIG. 1, red, green, and blue are selected as a combination for light emitting layers to emit white light. However, the present invention is not limited thereto and various colors, which may combine with each other to emit white light, may be used. Also, the order of the layers being stacked does not affect the emitting of white light. In addition, three emitting layers are separately formed in FIG. 1. However, it is possible to mix three luminescent substances to form one layer. Moreover, two or more luminescent substances may be mixed (or combined) and one layer or two layers may be formed.

The light emitting layer 41 realizing red light may be formed of a phosphorescent substance which includes carbazole biphenyl (CBP) or mCP as a host material and includes at least one selected from the group including bis(1-phenylisoquinoline)acetylacetonate iridium (PIQIr(acac)), bis(1-phenylquinoline)acetylacetonate iridium PQIr(acac)), tris(1-phenylquinoline) iridium (PQIr), and octaethylporphyrin platinum (PtPEP) as a dopant material. In addition, the light emitting layer 41 may be formed of a fluorescent substance such as PED:Eu(DBM)3(Phen) or Perylene.

The light emitting layer 42 realizing green light may be formed of a phosphorescent substance that includes CBP or mCP as a host material and includes fac tris(2-phenylpyridine)iridium (Ir(ppy)3) as a dopant material. In addition, the light emitting layer 42 may be formed of a fluorescent substance such as tris(8-hydroxyquinoline)aluminum (Alq3).

The light emitting layer 43 realizing blue light may be formed of a fluorescent substance including one selected from the group consisting of DPVBi, spiro-DPVBi, spiro-6P, distill benzene (DSB), distyrylarylene (DSA), a PFO-based polymer, a PPV-based polymer, and mixtures thereof.

The light emitting layers 41, 42, and 43 respectively emit red, green, and blue light may be formed as a common layer by depositing them in the plurality of pixels P1, P2, and P3 by using one open mask. Conversely, in an organic light emitting display device in which light emitting layers emitting separate colors in each pixel are formed (and thus separate colors are emitted by each pixel), the light emitting layers having each different color may be patterned in each pixel by using laser induced thermal imaging (LITI), inkjet printing, or vacuum depositing using a fine metal mask (FMM). Accordingly, the white light emitting layer 40 according to the embodiment of FIG. 1 may be easily formed without a separate patterning process for each pixel.

Although not illustrated, a material generally used to form the second thin film layer 50 is used to further form a hole blocking layer (HBL) (not illustrated). The HBL (not illustrated) may be formed of biphenoxy-bi(8-quinolitolato)aluminum (Balq).

The ETL 53 is formed on the white light emitting layer 40 in each pixel P1, P2, and P3 as a common layer with the same thickness. The ETL 53 may be formed of a polycyclic hydrocarbon based derivative, a heterocyclic compound, or tris(8-hydroxyquinolinato)aluminum (Alq3).

The EIL 54 is formed on the ETL in each pixel P1, P2, and P3 as a common layer having the same thickness throughout. The EIL 54 may be formed of LiF, Liq, NaF, or Naq.

In FIG. 1, a plurality of thin film layers including the HIL 51, the HTL 52, the ETL 53, and the EIL 54 is illustrated as the second thin film layer 50. However, the present invention is not limited thereto and other thin film layers may be added or removed, if necessary.

A filling member 70, which is filled with a filler so as to protect the organic light emitting display device 1, may be interposed between the second electrode 60 and the sealing substrate 80.

The sealing substrate 80 for sealing the first thin film layers 31 and 32, the white light emitting layer 40, and the second thin film layer 50 is formed on the filling member 70. In FIG. 1, the sealing substrate 80 sealed with a sealant (not illustrated) is disposed on the substrate 10; however, the present invention is not limited thereto. For example, a sealing structure (not illustrated) of a thin film formed by alternating a plurality of organic layers and inorganic layers may be formed on the filling member 70.

A typical organic light emitting display device including a white light emitting layer includes color filters (to realize a color display device). Accordingly, white light emitted from the white light emitting layer passes red, green, and blue color filters located in each pixel and emits red light, green light, and blue light in each pixel. Accordingly, different colors are realized in the display device due to combinations of the emitted colors of light.

However, in the organic light emitting display device 1 according to the embodiment in FIG. 1, red light R is emitted from the first pixel P1, green light G is emitted from the second pixel P2, and blue light B is emitted from the third pixel P3 without a separate color filter being installed. A principle of emitting specific colors in each pixel without color filters (by using the microcavity effect) is as follows.

When voltage is respectively applied to the first electrodes 21, 22, and 23 and the second electrode 60 in the organic light emitting display device 1, the first electrodes 21, 22, and 23 provide holes and the second electrode 60 provides electrons. When the holes and electrons are combined in the red light emitting layer 41, the green light emitting layer 42, and the blue light emitting layer 43, excitons (which are particles in an excited state) are generated and the excitons fall to a ground state, thereby emitting, for example, red, green, and blue light. The emitted colors of light are optically mixed with each other and the white light emitting layer 40 emits white light.

The white light emitted from the white light emitting layer 40 causes resonance to occur between the first electrodes 21, 22, and 23, which are reflective electrodes, and the second electrode 60, which is a semi-reflective/semitransparent electrode. Here, the thicknesses of the first electrodes 21, 22, and 23, the second electrode 60, the white light emitting layer 40, and the second thin film layer 50 are the same in all pixels P1, and P2, and P3. However, the thicknesses of the first thin film layers 31 and 32 vary according to each pixel P1, P2, and P3. That is, the thickness T1 of the HILs 31 and 51 in the first pixel P1 is the largest, the thickness T2 of the HILs 32 and 51 in the second pixel P2 is less than the thickness T1, and the thickness T3 of the HIL 51 in the third pixel P3 is the smallest. Accordingly, the optical distance of the first pixel is longer than the optical distance of the second pixel P2 and the optical distance of the second pixel P2 is longer than the optical distance of the third pixel P3.

Accordingly, the optical distances designed to each have a different length according to each pixel P1, P2, and P3 strengthens light emission of light that has a wavelength that is close to a wavelength corresponding to a resonant wavelength designed for each pixel P1, P2, and P3 of the white light emitted from the white light emitting layer 40, and suppresses light emission of light that has a wavelength that is close to other wavelengths. Accordingly, in the light emitted from the first pixel P1, the second pixel P2, and the third pixel P3, red light R, green light G, and blue light B are respectively strengthened and emitted.

For convenience of description, the first pixel P1 realizes red light, the second pixel P2 realizes green light, and the third pixel P3 realizes blue light; however, the present invention is not limited thereto. That is, each of the pixels P1, P2, and P3 may realize any one of red, green, and blue light regardless of the order. In addition, a combination of other colors, instead of red, green, and blue, which realize full color may be used. In addition, full color may be realized by a combination of four or more colors of pixels, instead of three colors of pixels.

In the organic light emitting display device 1 according to the embodiment of FIG. 1, color filters are not included. Therefore, problems such as a decrease in light emitting efficiency that takes place when light penetrates a color filter, and high voltage and high current required when color filters are used, may be solved and thus power consumption may be reduced. In addition, the light emitting layer is not formed by each pixel individually but is instead formed as a common layer, which simplifies fabrication of the light emitting layer.

Figure 2:
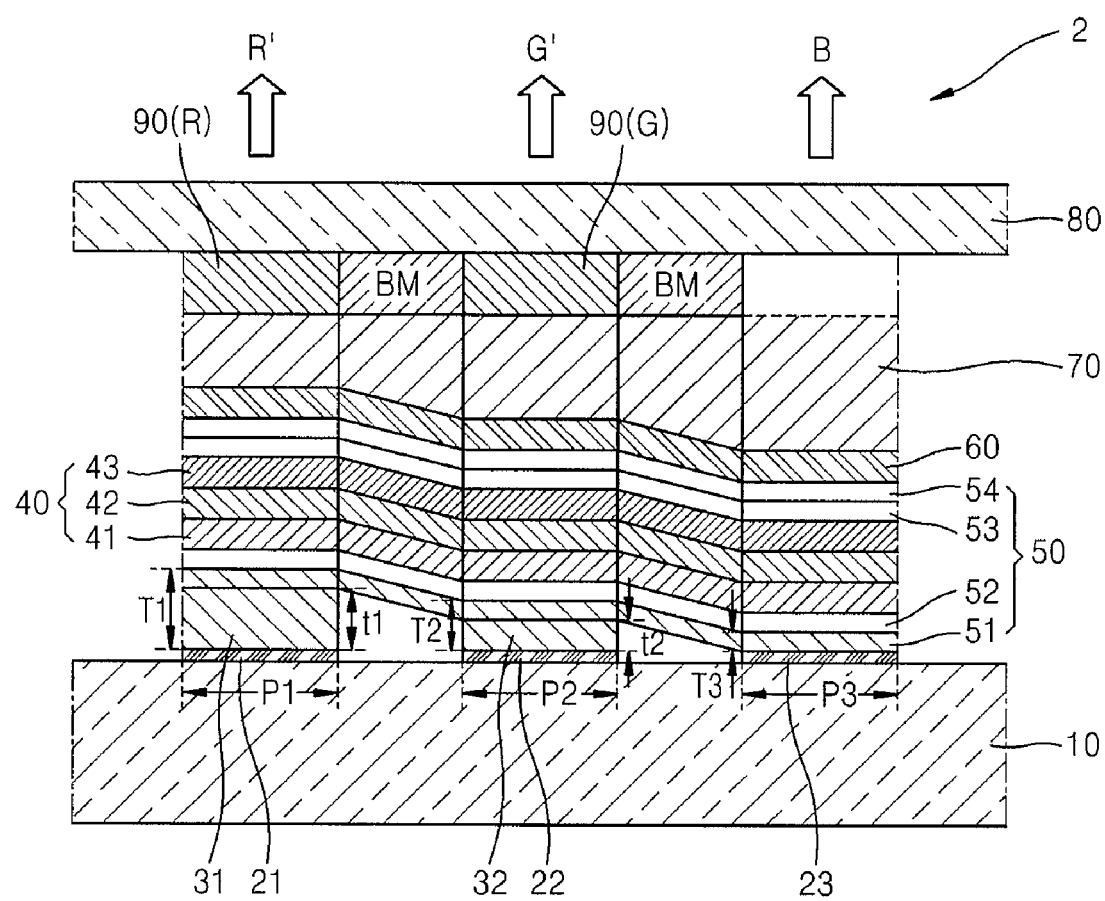
FIG. 2 is a cross-sectional view schematically illustrating some pixels in an organic light emitting display device, according to another embodiment of the present invention.
Figure 3:
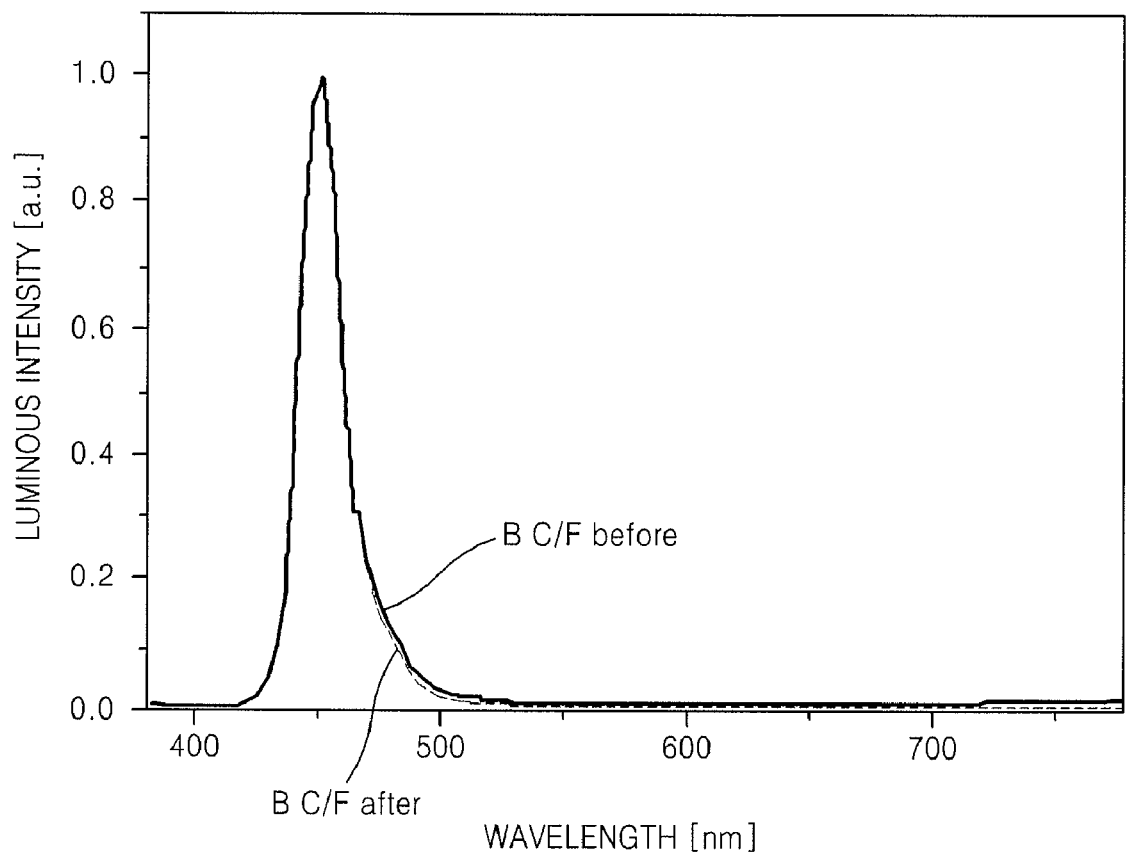
FIG. 3 is a graph illustrating luminous intensity of blue light before and after passing through a blue color filter in the organic light emitting display device of FIG. 2.

Hereinafter, an organic light emitting display device 2 according to another embodiment is described with reference to FIGS. 2 and 3. FIG. 2 is a cross-sectional view schematically illustrating some pixels in the organic light emitting display device 2, and FIG. 3 is a graph illustrating luminous intensity of blue light before and after the blue light passes through a blue color filter in the organic light emitting display device of FIG. 2. For consistency and convenience of description, structures in FIG. 2 representing the same or substantially similar structures with those of FIG. 1 use the same reference numerals.

Referring to FIG. 2, the organic light emitting display device 2 includes the plurality of first electrodes 21, 22, and 23 on the substrate 10, and the second electrode 60. The white light emitting layer 40, the first thin film layers 31 and 32, the second thin film layer 50, the filling member 70, and the second electrode 60 may be interposed between the plurality of first electrodes 21, 22, and 23 and the sealing substrate 80. Color filters 90 are located in some of the pixels P1 and P2 among the plurality of pixels P1, P2, and P3 on a surface of the sealing substrate 80 and black matrix BM is alternately arranged between the color filters 90. Here, like reference numerals in the organic light emitting display device 2 denote like elements in the organic light emitting display device 1.

Similar to the organic light emitting display device 1, the organic light emitting display device 2 includes the white light emitting layer 40, which emits white light, between the first electrodes 21, 22, and 23, which are reflective electrodes, and the second electrode 60, which is a semitransparent electrode. Also, a HIL is selected as the first thin film layers 31 and 32, and the HIL 51 is selected as one of the layers for forming the second thin film layer 50 as a common layer having the same thickness throughout and is formed on the first thin film layers 31 and 32 in all of the pixels P1, P2, and P3. Accordingly, as in the previous embodiment, total thicknesses T1, T2, and T3 obtained by adding the first thin film layers 31 and 32 and the HIL 51 of the second thin film layer 50 vary in each of the pixels P1, P2, and P3.

However, in the organic light emitting display device 2 according to the embodiment of FIG. 2, the color filters 90 are formed on the surface of the sealing substrate 80. The color filters 90 are not located in all colors of pixels as in a typical color filter arrangement, but are instead only located in some colors of pixels. For example, in the embodiment of FIG. 2, a red color filter 90R, which allows red light to penetrate, is located to correspond to the first pixel P1 and a green color filter 90G, which allows green light to penetrate, is located to correspond to the second pixel P2. However, a blue color filter is not located to correspond to the third pixel P3.

As in the embodiment of FIG. 1, in the organic light emitting display device 2, in which optical distances are designed to each have a different length in each pixel P1, P2, and P3 and a fine resonance effect is used, light emission of light that has a wavelength that is close to a wavelength corresponding to the resonant wavelength designed by each pixel P1, P2, and P3 of the white light emitted from the white light emitting layer 40 is strengthened while light emission of light that has a wavelength that is close to other wavelengths is suppressed. Accordingly, in the light emitted from the first pixel P1, the second pixel P2, and the third pixel P3, red light, green light, and blue light are respectively strengthened (e.g., enhanced to improve color purity) and emitted.

When the strengthened light is matched to a light source of the white light emitting layer 40 and passes through color filters having excellent transmissivity, the color gamut may be significantly improved. However, if color filters for all of the pixels, for example, red, green, and blue color filters, are employed, luminous efficiency of the organic light emitting display device is reduced by ⅓.

Accordingly, in the organic light emitting display device 2, the color filters are located in some pixels so that a decrease in luminous efficiency is reduced or minimized while the improved or maximum color gamut is maintained.

The red light emitted from the first pixel P1 passes through the red color filter 90R so as to be emitted as red light R' having a narrow bandwidth, the green light emitted from the first pixel P2 passes through the color filter 90G so as to be emitted as green light G' having a narrow bandwidth, and blue light B emitted from the third pixel P3 is directly emitted without passing through the color filter.

FIG. 3 illustrates an emission spectrum of blue light before and after passing through a blue color filter in the organic light emitting display device 2 of FIG. 2. Referring to FIG. 3, emission spectrum characteristics such as bandwidths before and after passing through the color filter are not significantly changed.

Table 1 below shows changes in characteristics of the organic light emitting display device before and after the blue color filter is employed.

Referring to Table 1, when the display device is driven to display the same desired brightness (in this case, 250 nits of panel brightness, white standard, and 74 nits of blue emission brightness) both without a blue color filter and when the blue color filter is employed, driving voltage and current density after the blue color filter is employed increases and efficiency decreases compared with the driving voltage and current density before the blue color filter is employed. In addition, emission characteristics, for example, blue coordinates and emission spectrum (refer to FIG. 3), are not significantly changed.

TABLE 1

|  | Driving voltage (V) | Applied current (mA/cm2) | Efficiency (Cd/A) | Blue coordinates (x, y) |
|---|---|---|---|---|
| Before Blue C/F is employed | 5.79 | 14.581 | 0.49 | (0.15, 0.03) |
| After Blue C/F is employed | 6.17 | 23.964 | 0.30 | (0.15, 0.03) |

In the organic light emitting display device according to the embodiment of FIG. 2, a blue color filter is not employed so that power consumption of the organic light emitting display device may be reduced due to the decrease in the driving voltage and current for blue light emission (as illustrated in Table 1), which corresponds to a desired brightness. Also, an efficiency decrease caused when the blue color filter is employed does not occur and thus panel efficiency of the organic light emitting display device may increase. In addition, some color filters (red and green) are employed and thus the color gamut of the organic light emitting display device may be strengthened. Moreover, the light emitting layer is not formed separately by each individual pixel but instead is formed as a common layer, and thus the light emitting layer fabrication may be simplified.

In the detailed description of the embodiment of FIG. 2, the organic light emitting display device in which the blue color filter is not employed is described. However, the present invention is not limited thereto. That is, red and/or green color filters may not be employed if power consumption is reduced and efficiency decrease does not occur while the same emission characteristics (color coordinates and emission spectrum) are substantially maintained.

According to the organic light emitting display device of embodiments of the present invention, all or some of the color filters are not employed so that problems such as a decrease in efficiency caused by light penetrating the color filters, and high voltage and high current required when the color filters are used, may be solved, and thus power consumption may be reduced. In addition, the light emitting layer is not formed by each pixel but is instead formed as a common layer so that the light emitting layer may be fabricated more simply.

While aspects of the present invention have been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light emitting display device comprising:
   a substrate; and
   a plurality of pixels on the substrate, each being configured to emit light of one of a plurality of second colors for forming white light when combined, the plurality of pixels comprising:
      a plurality of first electrodes;
      a second electrode;
      a white light emitting layer between the first electrodes and the second electrode and comprising a plurality of light emitting layers, each being configured to emit light of one of a plurality of first colors for forming white light when combined;
      a first thin film layer between the first electrodes and the second electrode, the first thin film layer having a plurality of thicknesses corresponding to the plurality of second colors; and
      color filters in only some of the plurality of pixels based on the color of light emitted by the some of the plurality of pixels,
   wherein each of the plurality of pixels is further configured to emit light of the one of the plurality of second colors when white light emitted from the white light emitting layer causes resonance to occur between the first electrodes and the second electrode.

2. The organic light emitting display device of claim 1, wherein the first thin film layer comprises at least one selected from the group consisting of a hole injection layer, a hole transport layer, a hole blocking layer, an electron injection layer, an electron transport layer, and an electron blocking layer.

3. The organic light emitting display device of claim 2, wherein the first thin film layer exists in less than all of the plurality of pixels.

4. The organic light emitting display device of claim 2, wherein the first thin film layer is formed by using one selected from the group consisting of laser induced thermal imaging (LITI), inkjet printing, and nozzle printing.

5. The organic light emitting display device of claim 1, wherein the plurality of pixels further comprises a second thin film layer between the first electrodes and the second electrode.

6. The organic light emitting display device of claim 5, wherein the second thin film layer comprises at least one selected from the group consisting of a hole injection layer, a hole transport layer, a hole blocking layer, an electron injection layer, an electron transport layer, and an electron blocking layer.

7. The organic light emitting display device of claim 5, wherein the second thin film layer is concurrently formed for each of the plurality of pixels.

8. The organic light emitting display device of claim 1, wherein the plurality of first colors is the same as the plurality of second colors.

9. The organic light emitting display device of claim 1, wherein the plurality of first colors comprises three colors.

10. The organic light emitting display device of claim 9, wherein the plurality of first colors comprises red, green, and blue.

11. The organic light emitting display device of claim 1, wherein the plurality of second colors comprises three colors.

12. The organic light emitting display device of claim 11, wherein the plurality of second colors comprises red, green, and blue.

13. The organic light emitting display device of claim 1, further comprising a pixel-defining layer formed around the first electrodes to define a light emitting region of the plurality of pixels.

14. The organic light emitting display device of claim 1, further comprising a sealing member on the second electrode to seal the white light emitting layer and the first thin film layer.

15. The organic light emitting display device of claim 14, wherein the sealing member comprises a substrate formed of glass.

16. The organic light emitting display device of claim 14, wherein the sealing member comprises a plurality of thin film layers formed by alternating a plurality of organic layers and inorganic layers.

17. The organic light emitting display device of claim 14, further comprising a filling member between the second electrode and the sealing member.

18. The organic light emitting display device of claim 1, wherein the first electrodes are one of reflective electrodes and semitransparent electrodes and the second electrode is one of a reflective electrode and a semitransparent electrode.

19. An organic light emitting display device comprising:
a substrate; and
a plurality of pixels on the substrate, each being configured to emit red, green, or blue light, the plurality of pixels comprising:
a plurality of first electrodes;
a second electrode;
a white light emitting layer between the first electrodes and the second electrode and comprising light emitting layers configured to emit red, green, and blue light for forming white light when combined;
a first thin film layer between the first electrodes and the second electrode, the first thin film layer having
a first thickness in each of the plurality of pixels configured to emit red light,
a second thickness different than the first thickness in each of the plurality of pixels configured to emit green light, and
a third thickness different than the first and second thicknesses in each of the plurality of pixels configured to emit blue light; and
color filters in only some of the plurality of pixels based on the color of light emitted by the some of the plurality of pixels,
wherein each of the plurality of pixels is further configured to emit the one of red light, green light, or blue light when white light emitted from the white light emitting layer causes resonance to occur between the first electrodes and the second electrode, and
wherein light in the only some of the plurality of pixels is emitted through the color filters in the only some of the plurality of pixels, and
wherein light in remaining ones of the plurality of pixels is emitted without passing through the color filters.

20. The organic light emitting display device of claim 19, wherein the first thin film layer comprises at least one selected from the group consisting of a hole injection layer, a hole transport layer, a hole blocking layer, an electron injection layer, an electron transport layer, and an electron blocking layer.

21. The organic light emitting display device of claim 19, wherein the plurality of pixels further comprises a second thin film layer between the first electrodes and the second electrode.

22. The organic light emitting display device of claim 21, wherein the second thin film layer comprises at least one selected from the group consisting of a hole injection layer, a hole transport layer, a hole blocking layer, an electron injection layer, an electron transport layer, and an electron blocking layer.

23. The organic light emitting display device of claim 19, further comprising a sealing member on the second electrode to seal the white light emitting layer and the first thin film layer.

24. The organic light emitting display device of claim 23, further comprising a filling member between the second electrode and the sealing member.

25. The organic light emitting display device of claim 19, wherein the first electrodes are one of reflective electrodes and semitransparent electrodes and the second electrode is one of a reflective electrode and a semitransparent electrode.

26. The organic light emitting display device of claim 19, wherein the color filters are on a surface of a sealing member or the substrate.

27. The organic light emitting display device of claim 26, further comprising black matrix between the color filters.

28. The organic light emitting display device of claim 5, wherein the second thin film layer is formed on the plurality of pixels as a common layer having a same thickness throughout.

* * * * *